(12) United States Patent
Chen et al.

(10) Patent No.: US 7,494,865 B2
(45) Date of Patent: Feb. 24, 2009

(54) FABRICATION METHOD OF METAL OXIDE SEMICONDUCTOR TRANSISTOR

(75) Inventors: Yu-Chi Chen, Hsinchu (TW); Jih-Wen Chou, Hsinchu (TW); Frank Chen, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 129 days.

(21) Appl. No.: 11/459,360

(22) Filed: Jul. 23, 2006

(65) Prior Publication Data

US 2007/0267691 A1    Nov. 22, 2007

(30) Foreign Application Priority Data

May 19, 2006    (TW) .............................. 95117818 A

(51) Int. Cl.
*H01L 21/8242* (2006.01)
(52) U.S. Cl. .................. 438/242; 438/246; 438/259; 438/270; 257/E21.655; 257/E27.091; 257/E27.095; 257/E29.201; 257/E29.26
(58) Field of Classification Search ................. 438/242, 438/246, 259, 270; 257/E21.655, E27.091, 257/E27.095, E29.201, E29.26
See application file for complete search history.

(56) References Cited

U.S. PATENT DOCUMENTS

| 6,472,302 | B1 | 10/2002 | Lee |
| 2004/0227164 | A1* | 11/2004 | Lee et al. ..................... 257/222 |
| 2004/0259311 | A1 | 12/2004 | Kim |
| 2005/0014338 | A1* | 1/2005 | Kim et al. ..................... 438/275 |
| 2006/0049445 | A1* | 3/2006 | Lee et al. ..................... 257/296 |
| 2007/0228473 | A1* | 10/2007 | Boyd et al. ................. 257/353 |

* cited by examiner

*Primary Examiner*—Long K Tran
(74) *Attorney, Agent, or Firm*—Jianq Chyun IP Office

(57) ABSTRACT

A manufacturing method of metal oxide semiconductor transistor is provided. A substrate is provided. A source/drain extension region is formed in the substrate. A pad material layer with low dielectric constant is formed on the substrate. A trench is formed in the substrate and the pad material layer. A gate dielectric layer is formed on the surface of the substrate in the trench. A stacked gate structure is formed in the trench, wherein the top surface of a conductive layer of the stacked gate structure is higher than the surface of the pad material layer. A spacer material layer is formed conformably on the substrate. Portions of the spacer material layer and the pad material layer are removed so as to form a pair of first spacers and a pair of pad blocks. A source/drain is formed on the substrate beside the stacked gate structure.

10 Claims, 3 Drawing Sheets

FABRICATION METHOD OF METAL OXIDE SEMICONDUCTOR TRANSISTOR

CROSS-REFERENCE TO RELATED APPLICATION

This application claims the priority benefit of Taiwan application serial no. 95117818, filed on May 19, 2006. All disclosure of the Taiwan application is incorporated herein by reference.

BACKGROUND OF THE INVENTION

1. Field of the Invention

The present invention relates to a semiconductor structure and a fabrication method thereof. More particularly, the present invention relates to a metal oxide semiconductor transistor and a fabrication method thereof.

2. Description of Related Art

As the process linewidth of semiconductor device are scaledown, the leakage current in the source/drain of MOSFET away from the gate has increased accordingly. The leakage current problem can be solved through thinner gate dielectric layer, however, when the linewidth is reduced to under 0.1 µm, the leakage current cannot be reduced even with a very thin gate dielectric layer.

Thus, MOSFET with trench gate is developed, such as FinFET, in order to resolve the above defect. This design include disposing the gate in the trench of the substrate to form a recess channel, so as to reduce the electric filed intensity in the channel, and reduce short channel effect and leakage current by increasing channel length.

However, in the foregoing transistor, the source/drain is generally disposed beside the gate, and the dopant concentration of the source/drain region is very high. Thus, after supplying voltage to the device to perform an operation, parasitic capacitance is generated at the gate dielectric layer between the highly doped source/drain region and the gate due to increase the electric field. Along with the increase of integration of semiconductor devices, the problem of parasitic capacitance has become more and more serious, which adversely affect the performance of the devices.

SUMMARY OF THE INVENTION

Accordingly, the present invention is directed to a method of fabricating a metal oxide semiconductor transistor for reducing the parasitic capacitance between the gate and the source/drain thereof.

According to another aspect of the present invention, a metal oxide semiconductor transistor is provided to improve the performance of a device.

The present invention provides a method of fabricating a metal oxide semiconductor transistor. According to this method, a substrate is first provided. Next, a source/drain extension region is formed in the substrate. Next, a pad material layer with low dielectric constant is formed on the substrate. After that, a trench is formed in the pad material layer and the substrate. Next, a gate dielectric layer is formed over the surface of the substrate in the trench. Next, a stacked gate structure is formed in the trench, wherein the top of a conductive layer of the stacked gate structure is higher than the surface of the pad material layer. Next, a spacer material layer is conformally formed on the substrate. Next, portions of the spacer material layer and the pad material layer are removed to form a first spacer and a pad block. Next, a source/drain is formed on the substrate beside the stacked gate structure.

The present invention further provides a metal oxide semiconductor transistor including a substrate, a stacked gate structure, a gate dielectric layer, a source/drain extension region, a source/drain, a pad block, and a first spacer. The stacked gate structure is disposed in the trench of the substrate, wherein the top of the conductive layer of the stacked gate structure is higher than the surface of the substrate. The gate dielectric layer is disposed between the substrate and the stacked gate structure. The source/drain extension region is disposed in the substrate beside the stacked gate structure. The source/drain is disposed on the substrate beside the stacked gate structure. The pad block is disposed on the substrate between the stacked gate structure and the source/drain and the pad block is a low dielectric constant material layer. The first spacer is disposed on the pad block and covers the stacked gate structure.

According to the metal oxide semiconductor transistor in the present invention, a pad block formed by low dielectric constant material is disposed between the conductive layer and the source/drain. Thus, the parasitic capacitance between the gate and the source/drain may be effectively reduced, and the performance of the device may be further improved.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A~1F are cross-sectional views illustrating the manufacturing flow of a metal oxide semiconductor transistor according to an embodiment of the present invention.

Figure 1A:
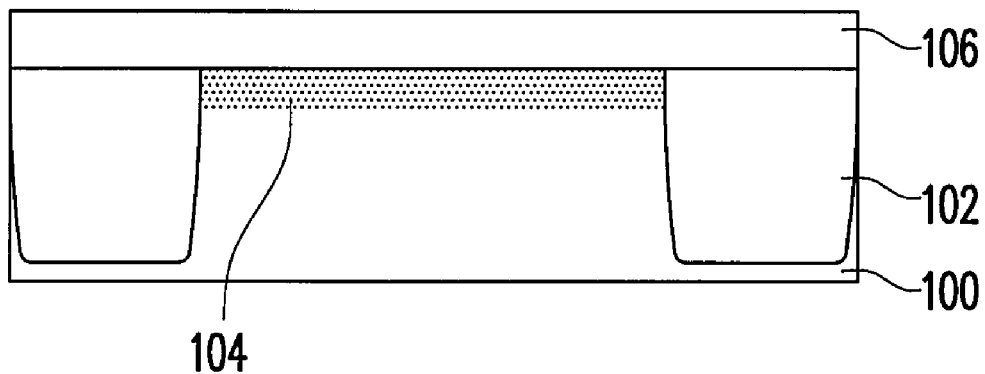
FIGS. 1A~1F are cross-sectional views illustrating the manufacturing flow of a metal oxide semiconductor transistor according to an embodiment of the present invention.

First, referring to FIG. 1A, a substrate 100 having a shallow trench isolation structure 102 formed therein is provided. Next, the source/drain extension region 104 is formed in the substrate 100, by performing, for example, an ion implantation process. Next, the pad material layer 106 is formed on the substrate 100. The pad material layer 106 comprises a low dielectric constant material layer and generally has a dielectric constant smaller than 4. The pad material layer 106 may be formed by, for example, performing a chemical vapor deposition process. The thickness of the pad material layer 106 is, for example, between 100 Å and 800 Å.

It should be noted that the pad material layer 106 will become a pad block between the conductive layer and the source/drain after subsequent process to reduce the parasitic capacitance between the conductive layer and the source/drain. Thus, silicon oxide or materials with lower dielectric constant than that of silicon oxide is generally used, such as silicon oxide, fluorinated silica glass (FSG), methylsilsesquioxane (MSQ), SiLK, porous-SiLK or other low dielectric constant materials.

Figure 1B:
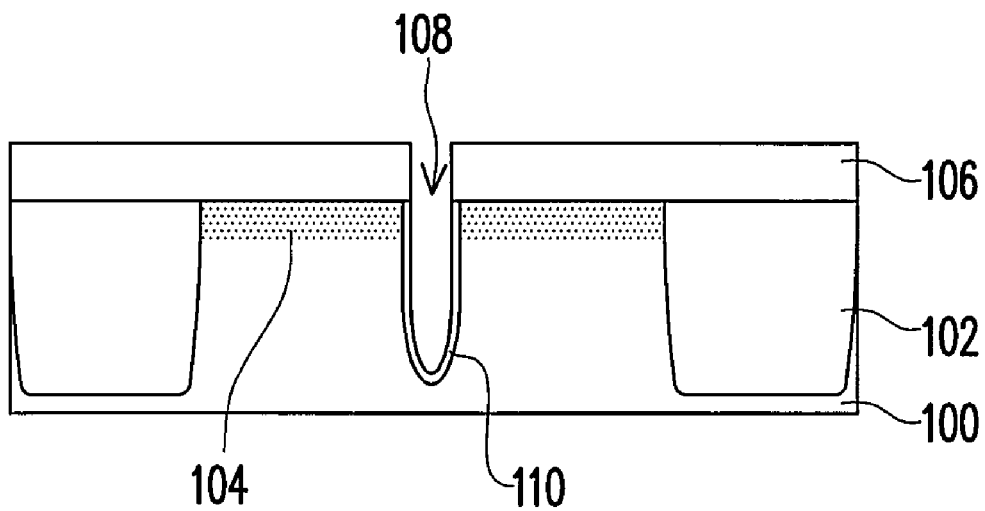

Next, referring to FIG. 1B, a trench 108 is formed in the substrate 100 and the pad material layer 106. The trench 108 may be formed by, for example, first forming a patterned photoresist layer (not shown) on the pad material layer 106; removing the exposed pad material layer 106 and portions of the substrate 100 using the patterned photoresist layer as mask; and removing the patterned photoresist layer.

Next, referring to FIG. 1B again, a gate dielectric layer 110 is formed on the surface of the substrate 100 in the trench 108. The gate dielectric layer 110 may be formed by, for example, forming a silicon oxide layer on the surface of the substrate 100 in the trench 108 through thermal oxidation, or forming a high dielectric constant material layer on the surface of the substrate 100 in the trench 108 by performing a chemical vapor deposition process.

Figure 1C:
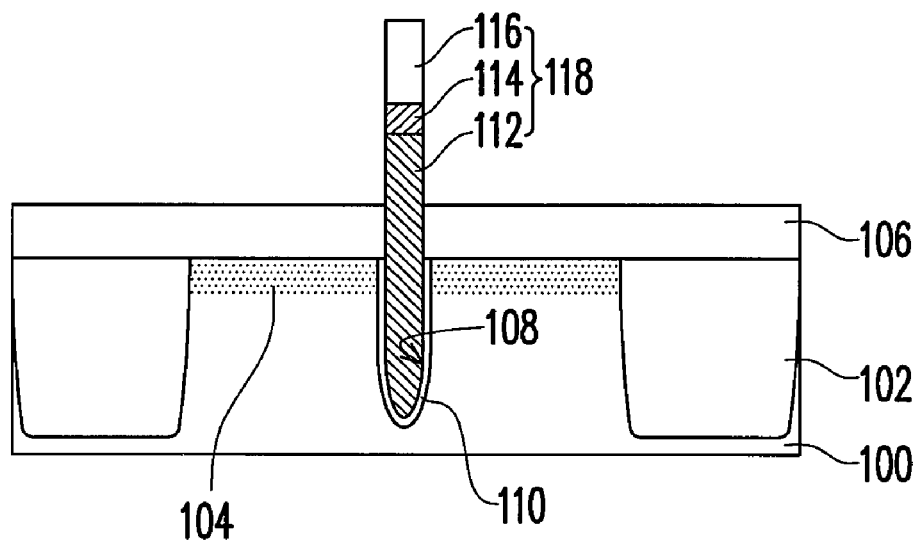

Next, referring to FIG. 1C, the stacked gate structure 118 is formed in the trench 108. The stacked gate structure 118 includes a polysilicon gate 112, a cap layer 116 on the polysilicon gate 112, and the metal silicide layer 114 between the polysilicon gate 112 and the cap layer 116, wherein the polysilicon gate 112 and the metal silicide layer 114 are both conductive layers and the tops of the conductive layers are higher than the surface of the pad material layer 106. The stacked gate structure 118 may be formed by, for example, forming a polysilicon gate material layer (not shown) on the pad material layer 106 and filling up the trench 108. The material of the polysilicon gate material layer is, for example, polysilicon or doped polysilicon, and may be formed by, for example, performing a chemical vapor deposition process. After that, a metal silicide material layer (not shown) and a cap material layer (not shown) are formed on the polysilicon gate material layer in sequence. The material of the metal silicide material layer is, for example, tungsten silicide, titanium silicide, cobalt silicide, tantalum silicide, nickel silicide, platinum silicide, or palladium silicide to reduce the resistance of the entire polysilicon gate 112, and may be formed by, for example, performing a chemical vapor deposition process. The material of the cap material layer is, for example, silicon nitride, and may be formed by, for example, performing a chemical vapor deposition process. Next, a patterned photoresist layer is formed on the cap material layer, and the patterned photoresist layer is disposed over the trench 108. After that, the exposed cap material layer, metal silicide material layer, and polysilicon gate material layer are removed using the patterned photoresist layer as mask. Next, the patterned photoresist layer is removed to form the stacked gate structure 118 composed of the cap layer 116, the metal silicide layer 114, and the polysilicon gate 112.

Moreover, the stacked gate structure 118 may also have additional layers. In another embodiment, the stacked gate structure may be formed by, for example, sequentially forming an adhesive material layer, a metal silicide material layer, and a cap material layer on the polysilicon gate material layer. The material of the adhesive material layer comprises, for example, tungsten nitride. Then, the cap material layer, the metal silicide material layer, the adhesive material layer, and the polysilicon gate material layer are patterned to from the stacked gate structure composed of a cap layer, a metal silicide layer, an adhesive layer, and a polysilicon gate. In yet another embodiment, the stacked gate structure may be formed by, for example, first sequentially forming a barrier material layer, an adhesive material layer, a metal material layer, and a cap material layer on the polysilicon gate material layer. The material of the barrier material layer comprises, for example, titanium nitride, the material of the adhesive material layer comprises, for example, tungsten nitride, and the metal material layer comprises, for example, tungsten metal layer. Then, the cap material layer, the metal silicide material layer, the adhesive material layer, the barrier material layer, and the polysilicon gate material layer are patterned to form stacked gate structure composed of a cap layer, a metal silicide layer, an adhesive layer, a barrier layer, and a polysilicon gate.

Figure 1D:
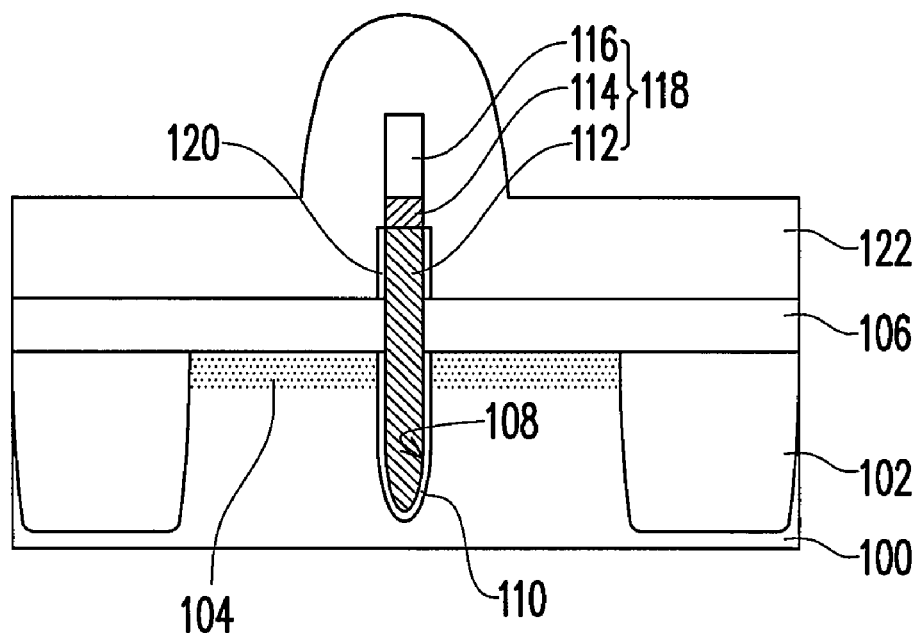

Next, referring to FIG. 1D, a spacer 120 can be selectively formed on the exposed side wall of the polysilicon gate 112 after forming the stacked gate structure 118. The spacer 120 may be formed by, for example, performing a rapid thermal process on the exposed polysilicon gate 112 to form an oxide layer on the surface of the polysilicon gate 112. This step is mainly performed to reduce defects on the surface of the polysilicon gate 112 caused by etching when forming the stacked gate structure, and to form the spacer 120 on the polysilicon gate 112 at the same time to prevent leakage current in the polysilicon gate 112 due to the defects. Next, the spacer material layer 122 is conformably formed on the substrate 100. The material of the spacer material layer 122 comprises, for example, silicon nitride or other suitable material, and may be formed by, for example, performing a chemical vapor deposition process.

Figure 1E:
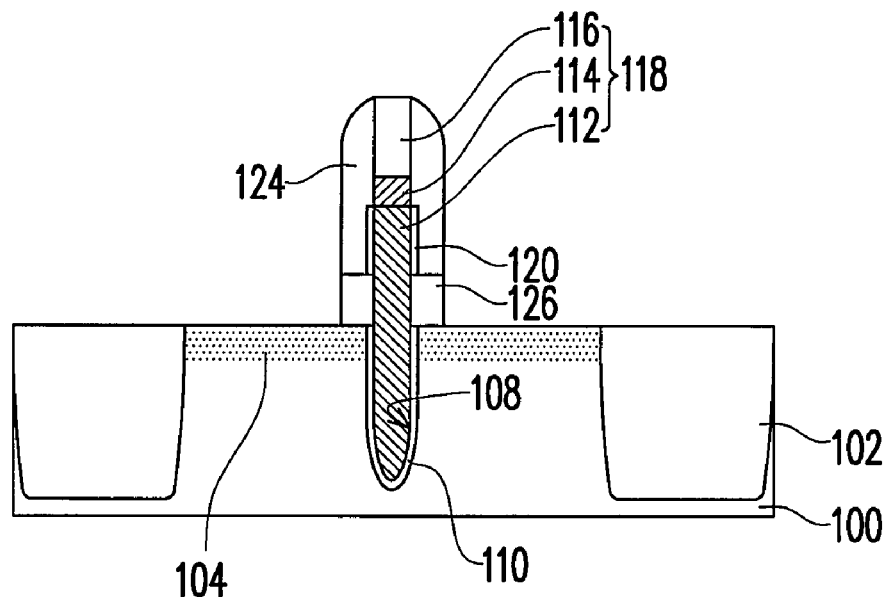

Next, referring to FIG. 1E, a portion of the spacer material layer 122 and a portion of the pad material layer 106 are removed to form the spacer 124 and the pad block 126 by performing, for example, an anisotropic etching process.

In another embodiment, if the etching rates of the spacer material layer 122 and that of the pad material layer 106 are very different, the aforementioned anisotropic etching process may also be used for removing portions of the spacer material layer 122 to form the spacer 124, and the exposed pad material layer 106 is removed using the spacer 124 as mask to form the pad block 126.

Figure 1F:
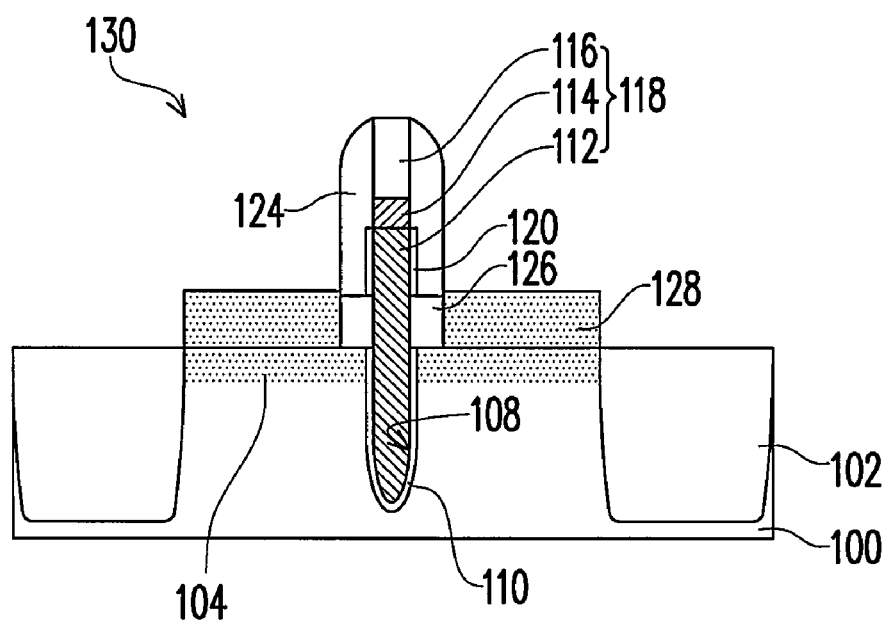

Next, referring to FIG. 1F, the source/drain 128 is formed on the substrate 100 beside the stacked gate structure 118, so as to form the metal oxide semiconductor transistor 130. The source/drain 128 may be formed by, for example, first forming an epitaxy layer beside the stacked gate structure 118 through selective epitaxy growing process, and then performing ion implantation process to the epitaxy layer.

It is to be noted that in the present embodiment, the pad block 126 is formed between the polysilicon gate 118 and the source/drain 128, and the dielectric constant of the material of the pad block 126 is lower than that of the material of the spacer 124, thus, the parasitic capacitance generated between the polysilicon gate 118 and the source/drain 128 can be reduced, and the device performance may be promoted.

In addition, other subsequent well known processes can be further carried out to complete the fabrication of the dynamic random access memory (DRAM) after forming the metal oxide semiconductor transistor 130. First, an internal dielectric layer is formed on the substrate 100 after forming the metal oxide semiconductor transistor 130. After that, contacts are formed in the internal dielectric layer and are electrically connected to the source/drain 128. Next, a bit line contact is formed on one of the contacts. Next, bit lines perpendicular to the stacked gate structure 118 are formed on the bit line contact and the bit lines are electrically connected to the source/drain 128. Besides, a capacitance contact is formed on another contact. Then, a capacitor is formed on the capacitance contact and the capacitor is electrically connected to the source/drain 128.

Below, the metal oxide semiconductor transistor according to an embodiment of the present invention will be described with reference to FIG. 1F, wherein the materials of some components of the metal oxide semiconductor transistor have already been described in foregoing embodiment, therefore will not be described again.

Referring to FIG. 1F, the metal oxide semiconductor transistor 130 includes a substrate 100, a stacked gate structure 118, a gate dielectric layer 110, a source/drain extension region 104, a source/drain 128, a pad block 126, and a spacer 124.

The stacked gate structure 118 is disposed in the trench 108 of the substrate 100. The stacked gate structure 118 includes a polysilicon gate 112, a cap layer 116 disposed on the polysilicon gate 112, and a metal silicide layer 114 disposed between the polysilicon gate 112 and the cap layer 116. Wherein, the top surface of the polysilicon gate 112 is higher than the surface of the substrate 100. The material of the metal silicide layer 114 is, for example, tungsten silicide, and the material of the cap layer 116 is, for example, silicon nitride.

In another embodiment, the materials of the stacked gate structure 118 are, from the substrate 100 upwards, polysilicon/tungsten nitride/tungsten silicide/silicon nitride in sequence. Wherein, tungsten nitride can be used as the adhesive layer between the polysilicon gate 112 and the metal silicide layer 114. In yet another embodiment, the materials of the stacked gate structure 118 are, from the substrate 100 upwards, are polysilicon/titanium nitride/tungsten nitride/tungsten/silicon nitride. Wherein titanium nitride can be used as the barrier layer on the polysilicon gate 112. Tungsten can be used as the metal layer (to replace the metal silicide layer 114). Tungsten nitride can be used as the adhesive layer between the polysilicon gate 112 and the metal layer.

Referring to FIG. 1F again, the gate dielectric layer 110 is disposed between the substrate 100 and the stacked gate structure 118. The source/drain extension region 104 is disposed in the substrate 100 beside the stacked gate structure 118. The source/drain 128 is disposed on the substrate 100 beside the stacked gate structure 118. The pad block 126 is disposed on the substrate 100 between the stacked gate structure 118 and the source/drain 128. The pad block 126 is, for example, low dielectric constant material layer and preferably, the dielectric constant thereof is smaller than 4. Generally, silicon oxide or other materials having lower dielectric constant is used, such as silicon oxide, fluorinated silica glass (FSG), methylsilsesquioxane (MSQ), SiLK, porous-SiLK or other low dielectric constant materials. The thickness of the pad block 126 is between 100 Å and 800 Å. The spacer 124 is disposed on the pad block 126 and the spacer 124 covers the stacked gate structure 118.

In another embodiment, the metal oxide semiconductor transistor 130 further includes a spacer 120 disposed between the polysilicon gate 112 and the spacer 124 and on the pad block 126. The spacer 120 can prevent leakage current produced due to defects on the side wall of the polysilicon gate 112.

It should be noted that in the present embodiment, the pad block 126 is disposed between the high concentration source/drain 128 and the polysilicon gate 112, and the dielectric constant of the material of the pad block 126 is lower than that of the material of the spacer 124, thus, the pad block 126 can effectively reduce the parasitic capacitance and further improve the performance of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal oxide semiconductor transistor, comprising:
   providing a substrate;
   forming a source/drain extension region in the substrate;
   forming a pad material layer with a low dielectric constant on the substrate;
   forming a trench in the pad material layer and the substrate;
   forming a gate dielectric layer on a surface of the substrate in the trench;
   forming a stacked gate structure in the trench, wherein a top surface of a conductive layer of the stacked gate structure is higher than a surface of the pad material layer;
   forming a second spacer on the exposed side wall of the conductive layer;
   conformally forming a spacer material layer on the substrate after the step of forming the second spacer;
   removing portions of the spacer material layer and the pad material layer to form a pair of first spacers and a pair of pad blocks; and
   forming a source/drain on the substrate beside the stacked gate structure.

2. The method as claimed in claim 1, wherein the thickness of the pad material layer is between 100 Å and 800 Å.

3. The method as claimed in claim 1, wherein the pad material layer is formed by performing a chemical vapor deposition process.

4. The method as claimed in claim 1, wherein the dielectric constant of the pad material layer is smaller than 4.

5. The method as claimed in claim 4, wherein the pad material layer comprises silicon oxide, fluorinated silica glass (FSG), methylsilsesquioxane (MSQ), SiLK, and porous-SiLK.

6. The method as claimed in claim 1, wherein the step of forming the trench comprises:
   forming a patterned photoresist layer on the substrate; and
   removing the exposed pad material layer and portions of the substrate using the patterned photoresist layer as mask.

7. The method as claimed in claim 1, wherein the step of forming the second spacer comprises performing a rapid thermal process.

8. The method as claimed in claim 1, wherein the step of forming the stacked gate structure comprises:
   forming a polysilicon gate material layer on the pad material layer and filling the trench;
   sequentially forming a metal silicide material layer and a cap material layer on the polysilicon gate material layer; and
   patterning the cap material layer, the metal silicide material layer, and the polysilicon gate material layer to form a polysilicon gate, a metal silicide layer, and a cap layer.

9. The manufacturing method as claimed in claim 1, wherein the step of forming the source/drain comprises:
   forming an epitaxy layer on the substrate beside the stacked gate structure; and
   performing an ion implantation process on the epitaxy layer.

10. The method as claimed in claim 1, wherein the step of forming the gate dielectric layer comprises a thermal oxidation process or a chemical vapor deposition process.

* * * * *